(12) United States Patent
Ming et al.

(10) Patent No.: US 10,353,417 B2
(45) Date of Patent: Jul. 16, 2019

(54) RIPPLE PRE-AMPLIFICATION BASED FULLY INTEGRATED LOW DROPOUT REGULATOR

(71) Applicants: University of Electronic Science and Technology of China, Chengdu (CN); Institute of Electronic and Information Engineering of UESTC in Guangdong, Dongguan (CN)

(72) Inventors: Xin Ming, Chengdu (CN); Jiahao Zhang, Chengdu (CN); Wenlin Zhang, Chengdu (CN); Di Gao, Chengdu (CN); Xuan Zhang, Chengdu (CN); Zhuo Wang, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 16/026,081

(22) Filed: Jul. 3, 2018

(65) Prior Publication Data
US 2019/0004553 A1   Jan. 3, 2019

(30) Foreign Application Priority Data
Jul. 3, 2017   (CN) .......................... 2017 1 0533403

(51) Int. Cl.
*G05F 1/575*   (2006.01)
*H03F 3/30*    (2006.01)
(Continued)

(52) U.S. Cl.
CPC ............. *G05F 1/575* (2013.01); *H03F 3/082* (2013.01); *H03F 3/3061* (2013.01);
(Continued)

(58) Field of Classification Search
CPC .. G05F 1/56–575; H03F 3/082; H03F 3/3061; H03F 3/45264; H03F 3/45269; H03F 3/45273
(Continued)

(56) References Cited

U.S. PATENT DOCUMENTS

| 5,850,409 A   * | 12/1998 | Link ................... H01S 5/06832 |
| | | 372/38.01 |
| 2005/0189930 A1* | 9/2005 | Wu ......................... G05F 1/575 |
| | | 323/280 |

(Continued)

*Primary Examiner* — Nguyen Tran
*Assistant Examiner* — Demetries A Gibson
(74) *Attorney, Agent, or Firm* — Gokalp Bayramoglu

(57) ABSTRACT

A ripple pre-amplification based fully integrated LDO pertains to the technical field of power management. The positive input terminal of a transconductance amplifier is connected to a reference voltage Vref, and the negative input terminal of the transconductance amplifier is connected to the feedback voltage $V_{fb}$. The output terminal of the transconductance amplifier is connected to the negative input terminal of a transimpedance amplifier and the negative input terminal of an error amplifier. The positive input terminal of the transimpedance amplifier is connected to the ground GND, and the output terminal of the transimpedance amplifier is connected to the positive input terminal of the error amplifier. The gate terminal of the power transistor $M_P$ is connected to the output terminal of the error amplifier, the source terminal of the power transistor $M_P$ is connected to an input voltage $V_{IN}$, and the drain terminal of the power transistor $M_P$ is grounded.

7 Claims, 6 Drawing Sheets

(51) Int. Cl.
*H03F 3/45* (2006.01)
*H03F 3/08* (2006.01)
(52) U.S. Cl.
CPC ..... *H03F 3/45183* (2013.01); *H03F 3/45264* (2013.01); *H03F 3/45269* (2013.01); *H03F 3/45273* (2013.01)
(58) Field of Classification Search
USPC .................................................. 323/273–281
See application file for complete search history.

(56) References Cited

U.S. PATENT DOCUMENTS

| | | | | |
|---|---|---|---|---|
| 2009/0079502 | A1* | 3/2009 | Tanaka | H03F 3/45183 330/259 |
| 2011/0267017 | A1* | 11/2011 | Zhang | G05F 1/575 323/280 |
| 2014/0306676 | A1* | 10/2014 | Hu | G05F 1/575 323/280 |
| 2015/0097534 | A1* | 4/2015 | Bhattad | G05F 1/462 323/270 |

* cited by examiner

US 10,353,417 B2

RIPPLE PRE-AMPLIFICATION BASED FULLY INTEGRATED LOW DROPOUT REGULATOR

CROSS REFERENCE TO RELATED APPLICATIONS

This application is based upon and claims priority to Chinese Patent Application No. 201710533403.6(CN), filed on Jul. 3, 2017, the entire content of which is incorporated herein by reference.

TECHNICAL FIELD

The present invention relates to the technical field of power management, in particular to a design of a low dropout regulator.

BACKGROUND

Low dropout regulators (LDOs) are an important kind of circuits in power management chips that are widely used in the fields of consumer electronics, medical electronics, and aerospace, etc., because of their characteristics of low noise, low cost, and low power consumption.

The LDO controls a power transistor by amplifying an error signal obtained from an output feedback, thereby providing an output current to drive the load. Essentially, the LDO is a voltage-controlled current source which adjusts the load current according to the output voltage, as shown in FIG. 1. The traditional full on-chip LDO (e.g. Cap-less LDO) includes an error amplifier (EA), a power transistor, a resistive feedback network, and a load capacitance. The basic working principle is that the resistive feedback network samples the output voltage to be differentially amplified with the reference voltage, and the load current is provided by controlling the power transistor.

As the power transistor has characteristic of high gain under light-load, in traditional on-chip LDO, the Miller capacitance is connected between the gate terminal and drain terminal of the power transistor in a bridging manner to separate a dominant pole located at the EA output and the non-dominant pole located at the LDO output, so as to ensure the stability of the loop. If the light-load current is small and the non-dominant pole moves closer to the low frequency, a large area of the Miller capacitance is required to separate the dominant and non-dominant poles, and the gain bandwidth product GBW of the loop is reduced. Due to limitations of bandwidth of EA and slew rate (SR), a certain delay is needed for charging and discharging the gate terminal capacitance of the power transistor by a current, the output capacitance is subjected to the load current during the delay, as a result, problems such as the undershoot of the output voltage is high and the time for establishing an overshoot is long etc. are caused.

SUMMARY

In order to solve the problem of slow transient response of the traditional on-chip fully integrated LDO (e.g. Cap-less LDO), the present invention provides a ripple pre-amplification based fully integrated low dropout regulator which can improve the speed of transient response while reducing the Miller capacitance.

The technical solution of the present invention is as follows.

A ripple pre-amplification based fully integrated LDO includes an error amplifier, a power transistor $M_P$, a Miller capacitance $C_L$, a first voltage dividing resistor $R_{f1}$, a second voltage dividing resistor $R_{f2}$, and a compensation circuit.

A gate terminal of the power transistor $M_P$ is connected to an output terminal of the error amplifier, a source terminal of the power transistor $M_P$ is connected to an input voltage $V_{IN}$, and the drain terminal of the power transistor $M_P$ is connected to the ground GND through a serially connected structure of the first voltage dividing resistor $R_{f1}$ and the second voltage dividing resistor $R_{f1}$. A series connection point of the first voltage dividing resistor $R_{f1}$ and the second voltage dividing resistor $R_{f2}$ outputs a feedback voltage $V_{fb}$. The Miller capacitance $C_L$ is connected between the drain terminal of the power transistor $M_P$ and the ground GND.

The compensation circuit is connected between the drain terminal of the power transistor $M_P$ and the series connection point of the first voltage dividing resistor $R_{f1}$ and the second voltage dividing resistor $R_{f1}$.

The ripple pre-amplification based fully integrated low dropout regulator further includes a transconductance amplifier and a transimpedance amplifier. A positive input terminal of the transconductance amplifier is connected to a reference voltage $V_{ref}$, and a negative input terminal of the transconductance amplifier is connected to the feedback voltage $V_{fb}$. An output terminal of the transconductance amplifier is connected to a negative input terminal of the transimpedance amplifier and a negative input terminal of the error amplifier. The positive input terminal of the transimpedance amplifier is connected to the ground GND, and the output terminal of the transimpedance amplifier is connected to a positive input terminal of the error amplifier.

Specifically, the transconductance amplifier includes a first NMOS transistor $M_{N1}$, a second NMOS transistor $M_{N2}$, a third NMOS transistor $M_{N3}$, a fourth NMOS transistor $M_{N4}$, a first PMOS transistor $M_{P1}$, a second PMOS transistor $M_{P2}$, a third PMOS transistor $M_{P3}$, a fourth PMOS transistor $M_{P4}$, and a fifth PMOS transistor $M_{P5}$.

A gate terminal of the second PMOS transistor $M_2$ serve as the negative input terminal of the transconductance amplifier, and the gate terminal of the third PMOS transistor $M_{P3}$ serve as the positive input terminal of the transconductance amplifier.

A drain terminal of the first PMOS transistor $M_{P1}$ is connected to source terminals of the second PMOS transistor $M_{P2}$ and the third PMOS transistor $M_{P3}$, and a gate terminal of the first PMOS transistor $M_{P1}$ is connected to a bias voltage $V_{bias}$.

The first NMOS transistor $M_{N1}$ and the third NMOS transistor $M_{N3}$ constitute a first current mirror, and a mirror ratio is $1:K_1$. The second NMOS transistor $M_{N2}$ and the fourth NMOS transistor $M_{N4}$ constitute a second current mirror, and a mirror ratio is $1:K_1$.

The gate terminal and drain terminal of the first NMOS transistor $M_{N1}$ are short-circuited and connected to the drain terminal of the second PMOS transistor $M_{P2}$ and the gate terminal of the third NMOS transistor $M_{N3}$. The gate terminal and drain terminal of the second NMOS transistor $M_{N2}$ are short-circuited and connected to the drain terminal of the third PMOS transistor $M_{P3}$ and the gate terminal of the fourth NMOS transistor $M_{N4}$. The gate terminal and drain terminal of the fifth PMOS transistor $M_{P5}$ are short-circuited and connected to the drain terminal of the third NMOS transistor $M_{N3}$ and the gate terminal of the fourth PMOS transistor $M_{P4}$.

Drain terminals of the fourth NMOS transistor $M_{N4}$ and the fourth PMOS transistor $M_{P4}$ are connected to each other and serve as the output terminal of the transconductance amplifier.

Source terminals of the first NMOS transistor $M_{N1}$, the second NMOS transistor $M_{N2}$, the third NMOS transistor $M_{N3}$, and the fourth NMOS transistor $M_{N4}$ are connected to the ground GND. The source terminals of the first PMOS transistor $M_{P1}$, the fourth PMOS transistor $M_{P4}$, and the fifth PMOS transistor $M_{P5}$ are connected to an input voltage $V_{IN}$.

Specifically, the transimpedance amplifier includes a resistor $R_f$, a fifth NMOS transistor $M_{N5}$, and a sixth PMOS transistor $M_{P6}$.

Gate terminals of the fifth NMOS transistor $M_{N5}$ and the sixth PMOS transistor $M_{P6}$ are connected to each other and serve as the negative input terminal of the transimpedance amplifier. The drain terminals of the fifth NMOS transistor $M_{N5}$ and the sixth PMOS transistor $M_{P6}$ are connected to each other and serve as an output terminal of the transimpedance amplifier. The source terminal of the fifth NMOS transistor $M_{N5}$ serve as the positive input terminal of the transimpedance amplifier. The source terminal of the sixth PMOS transistor $M_{P6}$ is connected to the input voltage $V_{IN}$, and the resistor $R_f$ is connected between the negative input terminal and the output terminal of the transimpedance amplifier.

Specifically, the error amplifier includes a sixth NMOS transistor $M_{N6}$, a seventh NMOS transistor $M_{N7}$, an eighth NMOS transistor $M_{N8}$, a ninth NMOS transistor $M_{N9}$, a tenth NMOS transistor $M_{N10}$, an eleventh NMOS transistor $M_{N11}$, a twelfth NMOS transistor $M_{N12}$, a thirteenth NMOS transistor $M_{N13}$, a seventh PMOS transistor $M_{P7}$, an eighth PMOS transistor $M_{P8}$, a ninth PMOS transistor $M_{P9}$, and a tenth PMOS transistor $M_{P10}$.

Gate terminals of the seventh NMOS transistor $M_{N7}$ and the eighth NMOS transistor $M_{N8}$ are connected to each other and serve as a negative input terminal of the error amplifier, and a width to length ratio of the seventh NMOS transistor $M_{N7}$ and the eighth NMOS transistor $M_{N8}$ is $K_2$. Gate terminals of the sixth NMOS transistor $M_{N6}$ and the ninth NMOS transistor $M_{N9}$ are connected to each other and serve as a positive input terminal of the error amplifier, and a width to length ratio of the sixth NMOS transistor $M_{N6}$ and the ninth NMOS transistor $M_{N9}$ is $K_2$.

A gate terminal and a drain terminal of the tenth PMOS transistor $M_{P10}$ are short-circuited and connected to a gate terminal of the seventh PMOS transistor $M_{P7}$ and a drain terminal of the eleventh NMOS transistor $M_{N11}$. A gate terminal of the tenth NMOS transistor $M_{N10}$ is connected to a gate terminal of the eleventh NMOS transistor $M_{N11}$ and drain terminals of the seventh NMOS transistor $M_{N7}$ and the eighth PMOS transistor $M_{P8}$. A drain terminal of the tenth NMOS transistor $M_{N10}$ is connected to source terminals of the seventh NMOS transistor $M_{N7}$ and the ninth NMOS transistor $M_{N9}$. A gate terminal of the twelfth NMOS transistor $M_{N12}$ is connected to a gate terminal of the thirteenth NMOS transistor $M_{N13}$ and drain terminals of the sixth NMOS transistor $M_{N6}$ and the ninth PMOS transistor $M_{P9}$. A drain terminal of the twelfth NMOS transistor $M_{N12}$ is connected to source terminals of the sixth NMOS transistor $M_{N6}$ and the eighth NMOS transistor $M_{N8}$. Gate terminals of the eighth PMOS transistor $M_{P8}$ and the ninth PMOS transistor $M_{P9}$ are connected to the bias voltage $V_{bias}$.

Drain terminals of the seventh PMOS transistor $M_{P7}$ and the thirteenth NMOS transistor $M_{N1}$ are connected to each other and serve as an output terminal of the error amplifier.

Source terminals of the tenth NMOS transistor $M_{N10}$, the eleventh NMOS transistor $M_{N11}$, the twelfth NMOS transistor $M_{N12}$, and the thirteenth NMOS transistor $M_{N13}$ are connected to the ground GND. Source terminals of the seventh PMOS transistor $M_{P7}$, the eighth PMOS transistor $M_{P8}$, the ninth PMOS transistor $M_{P9}$, and the tenth PMOS transistor $M_{P10}$, and drain terminals of the eighth NMOS transistor $M_{N8}$ and the ninth NMOS transistor $M_{N9}$ are connected to the input voltage $V_{IN}$.

Specifically, the compensation circuit includes a fourteenth NMOS transistor $M_{N14}$, a fifteenth NMOS transistor $M_{N15}$, a sixteenth NMOS transistor $M_{N16}$, an eleventh PMOS transistor $M_{P11}$, a twelfth PMOS transistor $M_{P12}$, a thirteenth PMOS transistor $M_{P13}$, and a capacitance $C_Z$.

Drain terminals of the twelfth PMOS transistor $M_{P12}$ and the sixteenth NMOS transistor $M_{N16}$ are connected to each other and connected to the series connection point of the first voltage dividing resistor $R_{f1}$ and the second voltage dividing resistor $R_{f2}$.

The eleventh PMOS transistor $M_{P11}$ and the twelfth PMOS transistor $M_{P12}$ constitute a third current mirror, and a mirror ratio is 1:$K_4$. A gate terminal and a drain terminal of the eleventh PMOS transistor $M_{P11}$ are short-circuited and connected to a gate terminal of the twelfth PMOS transistor $M_{P12}$ and a drain terminal of the fifteenth NMOS transistor $M_{N15}$. A gate terminal and a drain terminal of the fourteenth NMOS transistor $M_{N14}$ are short-circuited and connected to a drain terminal of the thirteenth PMOS transistor $M_{P13}$ and a gate terminal of the fifteenth NMOS transistor $M_{N15}$. The capacitance $C_Z$ is connected between a drain terminal of the power transistor $M_P$ and a drain terminal of the fourteenth NMOS transistor $M_{N14}$. Gate terminals of the thirteenth PMOS transistor $M_{P13}$ and the sixteenth NMOS transistor $M_{N16}$ are connected to the bias voltage $V_{bias}$.

Source terminals of the eleventh PMOS transistor $M_{P11}$, the twelfth PMOS transistor $M_{P12}$, and the thirteenth PMOS transistor $M_{P3}$ are connected to the input voltage $V_{IN}$. Source terminals of the fourteenth NMOS transistor $M_{N14}$, the fifteenth NMOS transistor $M_{N15}$, and the sixteenth NMOS transistor $M_{N16}$ are connected to the ground GND.

Specifically, the first voltage dividing resistor $R_{f1}$ and the second voltage dividing resistor $R_{f1}$ are PMOS transistors with short-circuited gate and drain terminals.

The working process of the present invention is as follows. A dividing voltage of the output voltage of the low dropout regulator, i.e. $V_{fb}$, is amplified through the transconductance amplifier and the transimpedance amplifier, and then sent to a differential input terminal of the error amplifier which is not limited by a tail current. Meanwhile, the compensation circuit is added at the voltage dividing point of the output voltage of the low dropout regulator, and an alternating current is fed under the alternating current (AC) condition, thereby introducing a pair of zero poles to compensate the loop.

The present invention has the following advantages. In the low dropout voltage regulator provided by the present invention, the changes of voltage output by the low dropout voltage regulator are rapidly amplified and sent to the input terminal of the error amplifier through the transconductance amplifier and transimpedance amplifier, thereby realizing a fast transient response. With the compensation circuit, it is not necessary to greatly increase the Miller capacitance, and the compulsory output pole is outside the gain bandwidth product GBW. As a result, not only the area of the chip is reduced, but also the gain bandwidth product GBW is increased, and the bandwidth and phase margin are improved as well. The circuit in the embodiment has a good loop stability under light load, and since the power transistor $M_P$ enters a linear region under heavy load, both of the loop gain bandwidth product GBW and the gain decrease.

DETAILED DESCRIPTION

The present invention will be described in detail with reference to the drawings and the embodiments.

Figure 1:
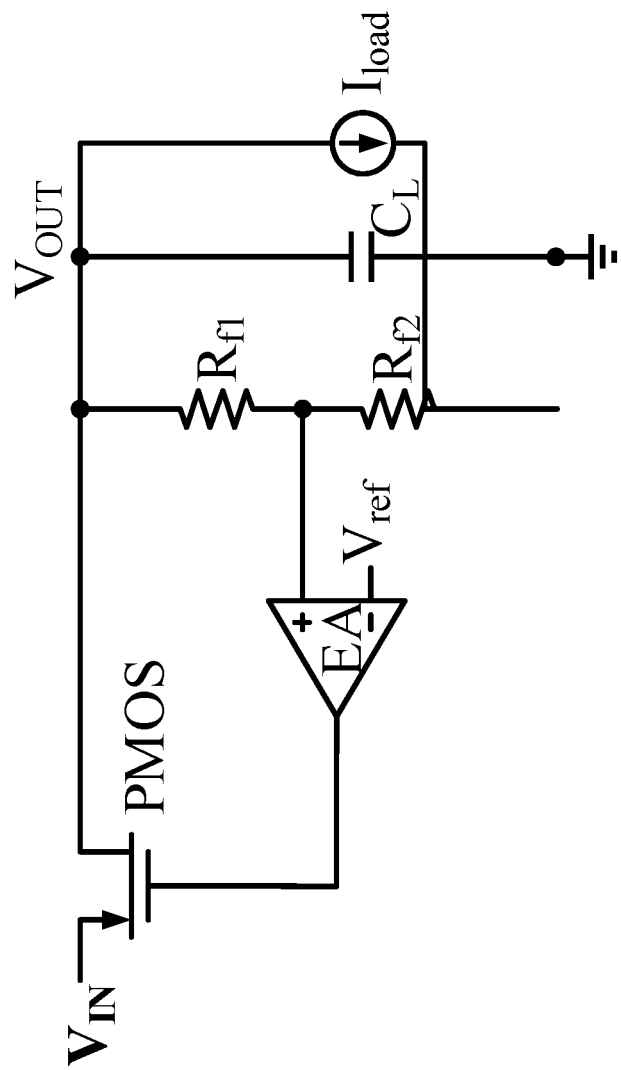
FIG. 1 is a topology structural diagram of a traditional Cap-less LDO circuit.
Figure 2:
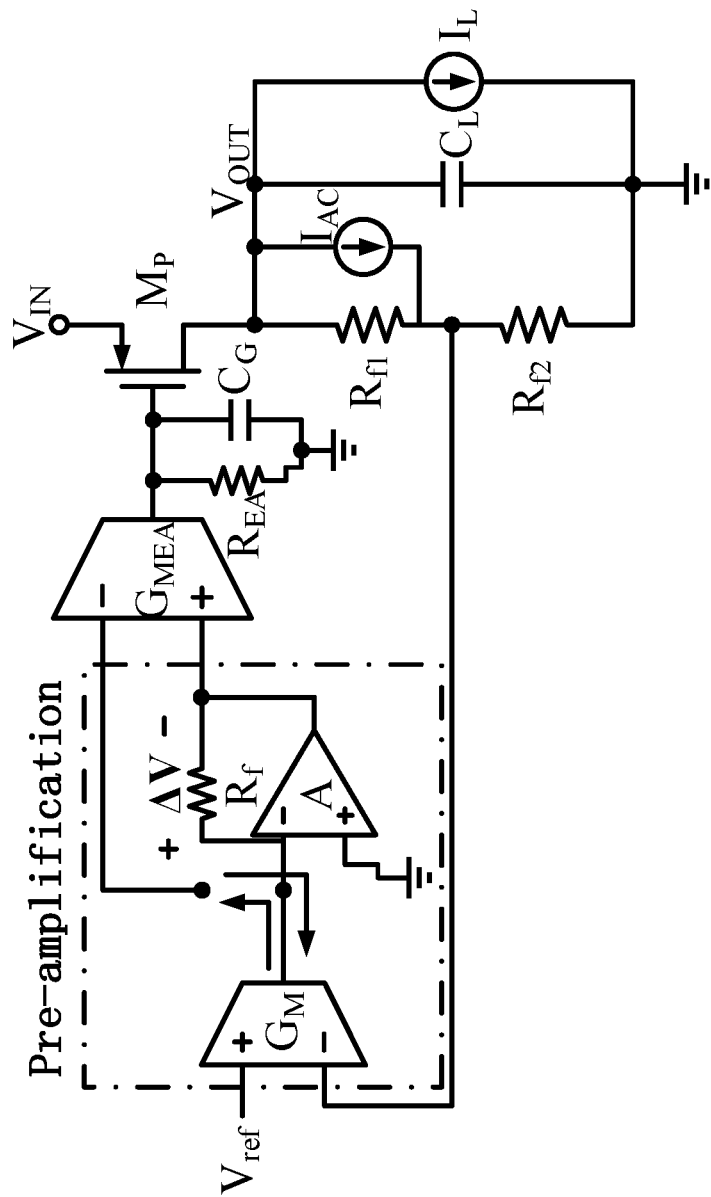
FIG. 2 is a configuration diagram of the ripple pre-amplification based fully integrated low dropout regulator provided by the present invention.

FIG. 2 shows a configuration diagram of the ripple pre-amplification based fully integrated low dropout regulator provided by the present invention which includes an error amplifier, a power transistor $M_P$, a Miller capacitance $C_L$, a first voltage dividing resistor $R_{f1}$, a second voltage dividing resistor $R_{f2}$, and a compensation circuit. The gate terminal of the power transistor $M_P$ is connected to the output terminal of the error amplifier, the source terminal of the power transistor $M_P$ is connected to the input voltage $V_{IN}$, and the drain terminal of the power transistor $M_P$ is connected to the ground GND through the series connection structure of the first voltage dividing resistor $R_{f1}$ and the second voltage dividing resistor $R_{f1}$. The series connection point of the first voltage dividing resistor $R_{f1}$ and the second voltage dividing resistor $R_{f1}$ outputs the feedback voltage $V_{fb}$. The Miller capacitance $C_L$ is connected between the drain terminal of the power transistor $M_P$ and the ground GND. The compensation circuit is connected between the drain terminal of the power transistor $M_P$ and the series connection point of the first voltage dividing resistor $R_{f1}$ and the second voltage dividing resistor $R_{f1}$. The ripple pre-amplification based fully integrated low dropout regulator also includes a transconductance amplifier and a transimpedance amplifier. The positive input terminal of the transconductance amplifier is connected to the reference voltage $V_{ref}$, the negative input terminal of the transconductance amplifier is connected to the feedback voltage $V_{fb}$, the output terminal of the transconductance amplifier is connected to the negative input terminal of the transimpedance amplifier and the negative input terminal of the error amplifier, the positive input terminal of the transimpedance amplifier is connected to the ground GND, and the output terminal of the transimpedance amplifier is connected to the positive input terminal of the error amplifier.

Figure 3:
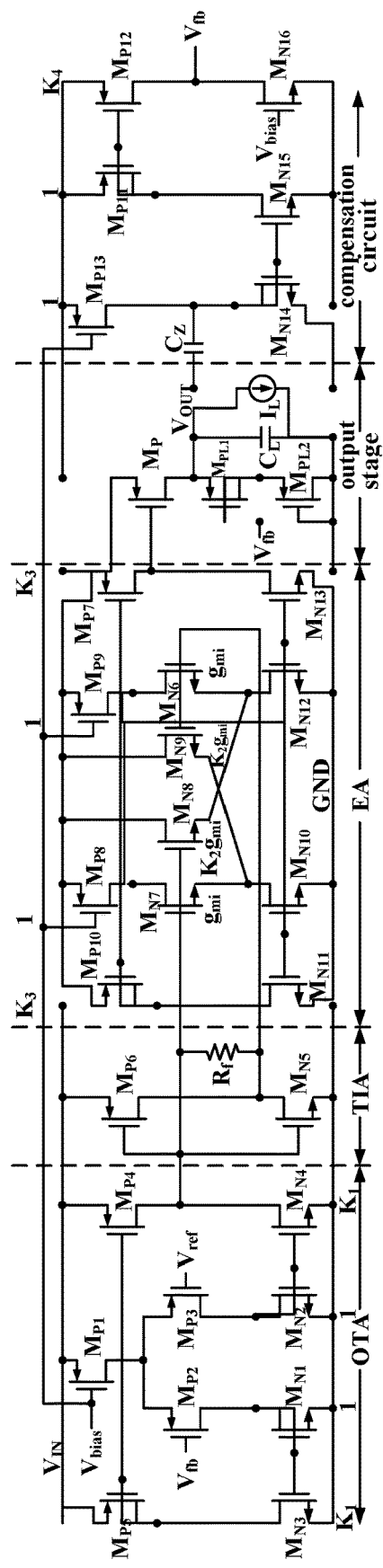
FIG. 3 is a schematic diagram showing transistor-level circuit implementation of the ripple pre-amplification based fully integrated low dropout regulator provided by the present invention.

In this embodiment, the transconductance amplifier OTA uses a classical push-pull transconductance amplifier structure shown in FIG. 3, which includes first NMOS transistor $M_{N1}$, second NMOS transistor $M_{N2}$, third NMOS transistor $M_{N3}$, fourth NMOS transistor $M_{N4}$, first PMOS transistor $M_{P1}$, second PMOS transistor $M_{P2}$, third PMOS transistor $M_{P3}$, fourth PMOS transistor $M_{P4}$, and fifth PMOS transistor $M_{P5}$. The gate terminal of the second PMOS transistor $M_{P2}$ serve as the negative input terminal of the transconductance amplifier. The gate terminal of the third PMOS transistor $M_{P3}$ serve as the positive input terminal of the transconductance amplifier. The drain terminal of the first PMOS transistor $M_{P1}$ is connected to the source terminals of the second PMOS transistor $M_{P2}$ and the third PMOS transistor $M_{P3}$, and the gate terminal of the first PMOS transistor $M_{P1}$ is connected to the bias voltage $V_{bias}$. The first NMOS transistor $M_{N1}$ and the third NMOS transistor $M_{N3}$ constitute a first current mirror, and the mirror ratio is $1:K_1$. The second NMOS transistor $M_{N2}$ and the fourth NMOS transistor $M_{N4}$ constitute a second current mirror, and the mirror ratio is $1:K_1$. The gate terminal and drain terminal of the first NMOS transistor $M_{N1}$ are short-circuited and connected to the drain terminal of the second PMOS transistor $M_{P2}$ and the gate terminal of the third NMOS transistor $M_{N3}$. The gate terminal and drain terminal of the second NMOS transistor $M_{N2}$ are short-circuited and connected to the drain terminal of the third PMOS transistor $M_{P3}$ and the gate terminal of the fourth NMOS transistor $M_{N4}$. The gate terminal and drain terminal of the fifth PMOS transistor $M_{P5}$ are short-circuited and connected to the drain terminal of the third NMOS transistor $M_{N3}$ and the gate terminal of the fourth PMOS transistor $M_{P4}$. The drain terminals of the fourth NMOS transistor $M_{N4}$ and the fourth PMOS transistor $M_{P4}$ are connected to each other and serve as the output terminal of the transconductance amplifier. The source terminals of the first NMOS transistor $M_{N1}$, the second NMOS transistor $M_{N2}$, the third NMOS transistor $M_{N3}$, and the fourth NMOS transistor $M_{N4}$ are connected to the ground GND. The source terminals of the first PMOS transistor $M_{P1}$, the fourth PMOS transistors $M_{P4}$, and the fifth PMOS transistors $M_{P5}$ are connected to the input voltage $V_{IN}$.

In this embodiment, the transimpedance amplifier TIA includes the resistor $R_f$, fifth NMOS transistor $M_{N5}$, and the sixth PMOS transistor $M_{N5}$. The gate terminals of the fifth NMOS transistor $M_{N5}$ and the sixth PMOS transistor MS are connected to each other and serve as the negative input terminal of the transimpedance amplifier. The drain terminals of the fifth NMOS transistor $M_{N5}$ and the sixth PMOS transistor $M_{P6}$ are connected to each other and serve as the output terminal of the transimpedance amplifier. The source terminal of the fifth NMOS transistor $M_{N5}$ serve as the positive input terminal of the transimpedance amplifier. The source terminal of the sixth PMOS transistor $M_{P6}$ is connected to the input voltage $V_{IN}$. The resistor $R_f$ is connected between the negative input terminal and output terminal of the transimpedance amplifier.

In this embodiment, the error amplifier includes sixth NMOS transistor $M_{N6}$, seventh NMOS transistor $M_{N7}$, eighth NMOS transistor $M_{N8}$, ninth NMOS transistor $M_{N9}$, tenth NMOS transistor $M_{N10}$, eleventh NMOS transistor $M_{N11}$, twelfth NMOS transistor $M_{N12}$, thirteenth NMOS transistor $M_{N13}$, seventh PMOS transistor $M_{P7}$, eighth PMOS transistor $M_{P8}$, ninth PMOS transistor $M_{P9}$, and tenth PMOS transistor $M_{P10}$. The gate terminals of the seventh NMOS transistor $M_{N7}$ and the eighth NMOS transistor $M_{N8}$ are connected to each other and serve as the negative input terminal of the error amplifier. The width to length ratio of the seventh NMOS transistor $M_{N7}$ and the eighth NMOS transistor $M_{N8}$ is $K_2$. The gate terminals of the sixth NMOS transistor $M_{N6}$ and the ninth NMOS transistor $M_{N9}$ are connected to each other and serve as the positive input terminal of the error amplifier. The gate terminal and drain terminal of the tenth PMOS transistor $M_{P10}$ are short-circuited and connected to the gate terminal of the seventh PMOS $M_{P7}$ and the drain terminal of the eleventh NMOS $M_{N11}$. The gate terminal of the tenth NMOS transistor $M_{N10}$ is connected to the gate terminal of the eleventh NMOS transistor $M_{N11}$ and the drain terminals of the seventh NMOS transistor $M_{N7}$ and the eighth PMOS transistor $M_{P5}$. The drain terminal of the tenth NMOS $M_{N10}$ is connected to the source terminals of the seventh NMOS transistor $M_{N7}$ and the ninth NMOS transistor $M_{N9}$. The gate terminal of the twelfth NMOS transistor $M_{N12}$ is connected to the gate terminal of the thirteenth NMOS transistor $M_{N13}$ and the drain terminals of the sixth NMOS transistor $M_{N6}$ and the ninth PMOS transistor $M_{P9}$. The drain terminal of the twelfth NMOS transistor $M_{N12}$ is connected to the source terminals of the sixth NMOS transistor $M_{N6}$ and the eighth NMOS transistor $M_{N8}$. The gate terminals of the eighth PMOS transistor $M_{P8}$ and the ninth PMOS transistor $M_{P9}$ are connected to the bias voltage $V_{bias}$. The drain terminals of the seventh PMOS transistor $M_{P7}$ and the thirteenth NMOS transistor $M_{N13}$ are connected to each other and serve as the output terminal of the error amplifier. The source terminals of the tenth NMOS transistor $M_{N10}$, the eleventh NMOS transistor $M_{N11}$, the twelfth NMOS transistor $M_{N12}$ and the thirteenth NMOS transistor $M_{N13}$ are connected to the ground GND. The source terminals of the seventh PMOS transistor $M_{P7}$, the eighth PMOS transistor $M_{P5}$, the ninth PMOS transistor $M_{P9}$, and the tenth PMOS $M_{P10}$ and the drain terminals of the eighth NMOS transistor $M_{N8}$ and the ninth NMOS transistor $M_{N9}$ are connected to the input voltage $V_{IN}$.

The transconductance amplifier (e.g. operational transconductance amplifier OTA) detects the difference between the feedback voltage $V_{fb}$ divided by the output terminal of the LDO and the reference voltage $V_{ref}$, and draws/feeds a current to the resistor $R_f$ of the transconductance amplifier (TIA), so that a large differential voltage is formed at the input terminal of the error amplifier (EA). The differential voltage is amplified by the error amplifier (EA), then a large current is drawn out from the input power supply $V_{IN}$ and mirrored to the output stage to determine the gate terminal potential of the power transistor $M_P$ and provide a corresponding load current $I_L$. Since a dynamic bias structure is used in the error amplifier (EA) in this embodiment, the larger the differential input voltage, the larger is the output current. As a result, with the use of the ripple pre-amplification function, the present invention can better benefit from the advantages to achieve better dynamic adjustment performance.

The loop low frequency gain can be calculated as according to the following equation:

$$A_{LG}=K_1 g_{mP2} R_f K_2 g_{mi} K_3 (r_{oN13} \| r_{oP7}) G_{MP} R_{OUT} \quad (1)$$

where $G_{MP}$, $R_{OUT}$ represent the transconductance and output impedance of the power transistor $M_P$, respectively. $K_1$-$K_3$ are the mirror ratios in FIG. 3, $g_{mP2}$, $g_{mi}$ are the transconductance relative to the transistor of the inputs of the operational transconductance amplifier (OTA) and the error amplifier (EA), respectively, $r_{oN13}$, $r_{oP7}$ are the small-signal equivalent impedances of the thirteenth NMOS transistor $M_{N13}$ and the seventh PMOS transistor $M_{P7}$ of the output stage of the error amplifier (EA), respectively.

The present invention provides a loop compensation solution. The compensation circuit in this embodiment includes fourteenth NMOS transistor $M_{N14}$, fifteenth NMOS transistor $M_{N15}$, sixteenth NMOS transistor $M_{N16}$, eleventh PMOS transistor $M_{P11}$, twelfth PMOS transistor $M_{P12}$, thirteenth PMOS transistor $M_{P13}$, and the capacitance $C_Z$. The drain terminals of the twelfth PMOS transistor $M_{P12}$ and the sixteenth NMOS transistor $M_{N16}$ are connected to each other and connected to the series connection point of the first voltage dividing resistor $R_{f1}$ and the second voltage dividing resistor $R_{f2}$. The eleventh PMOS transistor $M_{P11}$ and the twelfth PMOS transistor $M_{P12}$ constitute a third current mirror, and the mirror ratio is 1:$K_4$. The gate terminal and drain terminal of the eleventh PMOS transistor $M_{P11}$ are short circuited and connected to the gate terminal of the twelfth PMOS transistor $M_{P12}$ and the drain terminal of the fifteenth NMOS transistor $M_{N15}$. The gate terminal and drain terminal of the fourteenth NMOS transistor $M_{N14}$ are short circuited and connected to the drain terminal of the thirteenth PMOS transistor $M_{13}$ and the gate terminal of the fifteenth NMOS transistor $M_{N15}$. The capacitance $C_Z$ is connected between the drain terminal of the power transistor $M_P$ and the drain terminal of the fourteenth NMOS transistor $M_{N14}$. The gate terminals of the thirteenth PMOS transistor $M_{P13}$ and the sixteenth NMOS transistor $M_{N16}$ are connected to the bias voltage $V_{bias}$. The source terminals of the eleventh PMOS transistor $M_{P11}$, the twelfth PMOS transistor $M_{P12}$, and the thirteenth PMOS transistor $M_{P13}$ are connected to the input voltage $V_{IN}$. The source terminals of the fourteenth NMOS transistor $M_{N14}$, the fifteenth NMOS transistor $M_{N15}$, and the sixteenth NMOS transistor $M_{N16}$ are connected to the ground GND. In this embodiment, the first voltage dividing resistor $R_{f1}$ and the second voltage dividing resistor $R_{f1}$ are PMOS transistors with gate terminals and drain terminals short circuited, i.e. $M_{PL1}$ and $M_{PL2}$ in FIG. 3.

The compensation circuit does not change $V_{fb}$ in the case of direct current (DC), and a current is fed into the voltage dividing point of the LDO through the capacitance $C_Z$ in the case of alternating current (AC), thereby producing a pair of zero poles $\omega_{ZC}$, which are respectively expressed as below:

$$\omega_{ZC} = -\frac{g_{mP10} g_{mL}}{C_Z(K_4 g_{mP10} + g_{mL})} \quad (2)$$

$$\omega_{pl} = -\frac{g_{mP10}}{C_Z} \quad (3)$$

where $g_{mL}$ represents the transconductance of $M_{PL1}$ and $M_{PL2}$ in FIG. 3, with the compensation circuit, the output pole does not need to be completely outside the gain bandwidth product GBW. If the parameters are set properly, the zero point can be slightly higher than the gain bandwidth product GBW to compensate a part of the phase margin caused by appearance of the output pole in the gain bandwidth product GBW and at the same time the parasitic pole is pushed to high frequency to be offset with zero points of left half plane formed by Miller compensation. In this way, the Miller capacitance does not need to be excessively increased, and the compulsory output pole is outside the gain bandwidth product GBW, as a result, not only the area of the chip is reduced, but also the gain bandwidth product GBW is increased.

Figure 4:
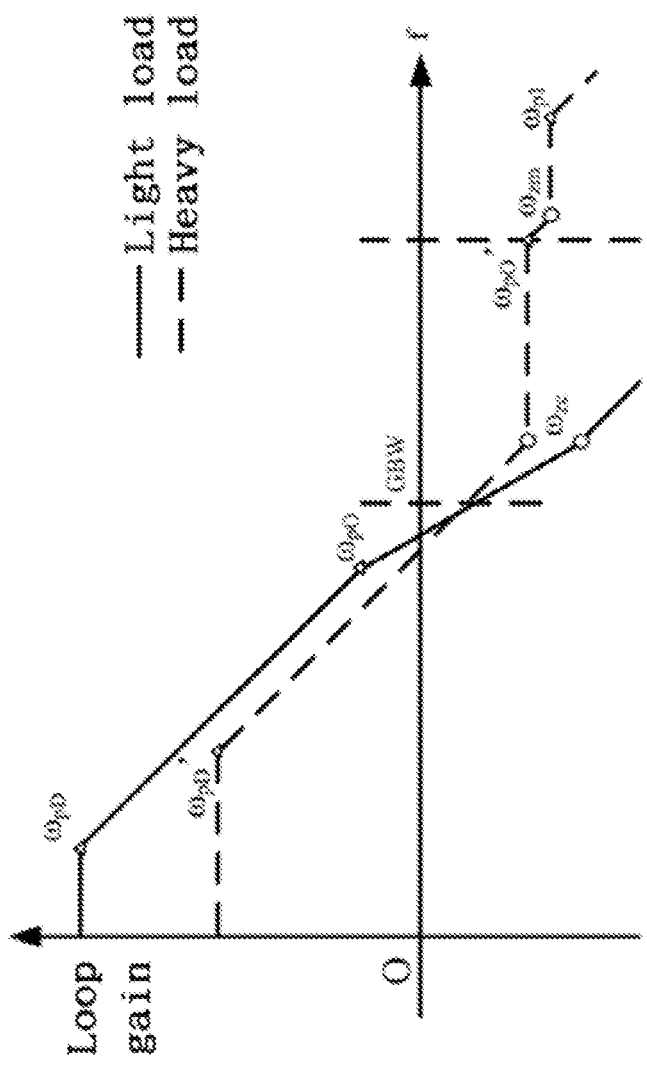
FIG. 4 is a schematic diagram showing a design of the distribution of the zero poles of the loop of the ripple pre-amplification based fully integrated low dropout regulator provided by the present invention.

FIG. 4 shows a loop stability design of the LDO of the present invention. The zero poles with position changes under light and heavy loads condition are represented by $\omega_{pD}$ in light load condition and $\omega_{pD'}$ in heavy load condition. The zero poles in the medium and high frequency are ignored, only the main pole $\omega_{pD}$ at the gate terminal of the power transistor $M_P$, the output pole $\omega_{pO}$ of the LDO, the Miller zero pole $\omega_{zm}$, and the pair of zero poles $\omega_{zc}$, $\omega_{pl}$ at the medium and low frequency generated after the compensation circuit is introduced are considered. As shown in FIG. 4, the 0-dB bandwidth and phase margin are improved after the compensation circuit is added.

Figure 5:
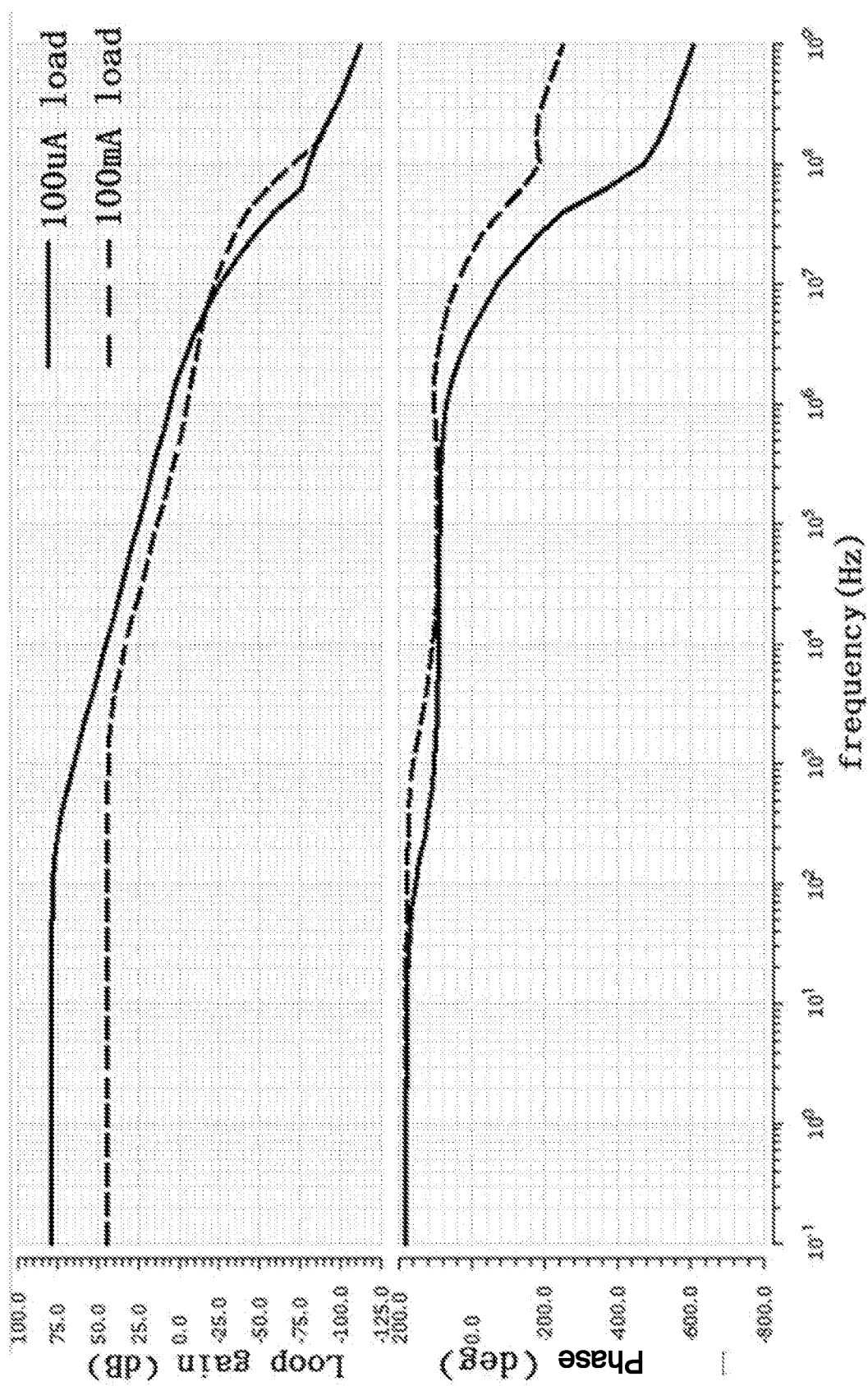
FIG. 5 is a schematic diagram showing an AC simulation curve of the ripple pre-amplification based fully integrated low dropout regulator provided by the present invention.

FIG. 5 shows the ac response curves of light load 100 uA with solid line and heavy load 100 mA with dashed line, respectively. The loop gains are 78.8 dB and 44.5 dB, respectively. The 0 dB bandwidths are 1.81 MHz and 500 kHz respectively. The phase margins are 48.2° and 97.7° respectively. The LDO provided by the present invention has a good loop stability under the light load. The loop gain bandwidth product GBW and the gain are both decreased under the heavy load since the power transistor enters the linear region.

Figure 6:
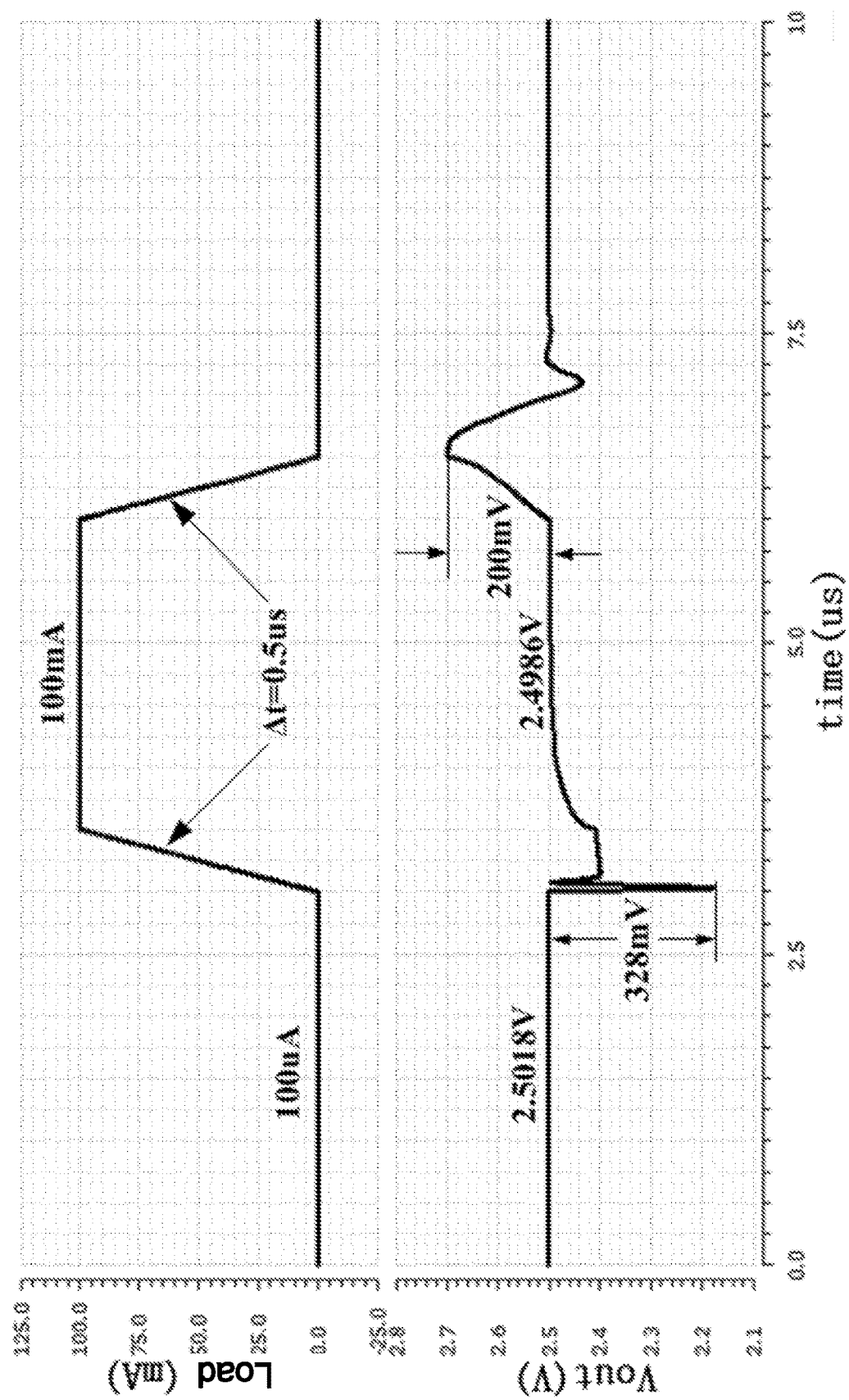
FIG. 6 is a schematic diagram showing the transient response curve of the ripple pre-amplification based fully integrated low dropout regulator provided by the present invention.

FIG. 6 shows the transient response curve of the LDO provided by the present invention, the load is switched between 100 uA and 100 mA within 0.5 us. The undershoot of the structure provided by the present invention is within 330 mV, thereby achieving a fast transient response.

Various specific variations and combinations can be derived by those of ordinary skill in the art according to the teachings of the present disclosure without departing from the essence of the present invention. These variations and combinations, however, should still be considered as falling within the scope of the present invention.

What is claimed is:

1. A ripple pre-amplification based fully integrated low dropout regulator, comprising:
    an error amplifier,
    a power transistor,
    a miller capacitance,
    a first voltage dividing resistor,
    a second voltage dividing resistor,
    a compensation circuit,
    a transconductance amplifier, and
    a transimpedance amplifier, wherein
      a gate terminal of the power transistor is connected to an output terminal of the error amplifier, a source terminal of the power transistor is connected to an input voltage, and a drain terminal of the power transistor is connected to ground through a series connection structure of the first voltage dividing resistor and the second voltage dividing resistor;
      a series connection point of the first voltage dividing resistor and the second voltage dividing resistor outputs a feedback voltage;
      the Miller capacitance is connected between the drain terminal of the power transistor and the ground;
      the compensation circuit is connected between the drain terminal of the power transistor and the series connection point of the first voltage dividing resistor and the second voltage dividing resistor; wherein
      a positive input terminal of the transconductance amplifier is connected to a reference voltage,
      a negative input terminal of the transconductance amplifier is connected to the feedback voltage,
      an output terminal of the transconductance amplifier is connected to a negative input terminal of the transimpedance amplifier and a negative input terminal of the error amplifier; and
    a positive input terminal of the transimpedance amplifier is connected to the ground, and an output terminal of the transimpedance amplifier is connected to a positive input terminal of the error amplifier wherein
      the transconductance amplifier comprises a first NMOS transistor, a second NMOS transistor, a third NMOS transistor, a fourth NMOS transistor, a first PMOS transistor, a second PMOS transistor, a third PMOS transistor, a fourth PMOS transistor and a fifth PMOS transistor; wherein
      a gate terminal of the second PMOS transistor serve as the negative input terminal of the transconductance amplifier, and a gate terminal of the third PMOS transistor serve as the positive input terminal of the transconductance amplifier;
      a drain terminal of the first PMOS transistor is connected to source terminals of the second PMOS transistor and the third PMOS transistor, and a gate terminal of the first PMOS transistor is connected to a bias voltage;
      the first NMOS transistor and the third NMOS transistor constitute a first current mirror, a first mirror ratio is 1:$K_1$, where $K_1$ is any real number;
      the second NMOS transistor and the fourth NMOS transistor constitute a second current mirror, and a second mirror ratio is 1:$K_1$, where $K_1$ is any real number;
      a gate terminal and a drain terminal of the first NMOS transistor are short-circuited and connected to a drain terminal of the second PMOS transistor and a gate terminal of the third NMOS transistor;
      a gate terminal and a drain terminal of the second NMOS transistor are short-circuited and connected to a drain terminal of the third PMOS transistor and a gate terminal of the fourth NMOS transistor;
      a gate terminal and a drain terminal of the fifth PMOS transistor are short-circuited and connected to a drain terminal of the third NMOS transistor and a gate terminal of the fourth PMOS transistor;
      a drain terminal of the fourth NMOS transistor and a drain terminal of the fourth PMOS transistor are connected to each other and serve as the output terminal of the transconductance amplifier;
      source terminals of the first NMOS transistor, the second NMOS transistor, the third NMOS transistor, and the fourth NMOS transistor are connected to the ground; and
      source terminals of the first PMOS transistor, the fourth PMOS transistor, and the fifth PMOS transistor are connected to the input voltage.

2. The ripple pre-amplification based fully integrated low dropout regulator according to claim 1, wherein
    the transimpedance amplifier comprises a resistor, a fifth NMOS transistor and a sixth PMOS transistor,
    a gate terminal of the fifth NMOS transistor and a gate terminal of the sixth PMOS transistor are connected to each other and serve as the negative input terminal of the transimpedance amplifier;
    a drain terminal of the fifth NMOS transistor and a drain terminal of the sixth PMOS transistor are connected to each other and serve as the output terminal of the transimpedance amplifier;
    a source terminal of the fifth NMOS transistor serve as the positive input terminal of the transimpedance amplifier;

a source terminal of the sixth PMOS transistor is connected to the input voltage; and the resistor is connected between the negative input terminal and the output terminal of the transimpedance amplifier.

3. The ripple pre-amplification based fully integrated low dropout regulator according to claim 2, wherein the error amplifier comprises a sixth NMOS transistor, a seventh NMOS transistor, an eighth NMOS transistor, a ninth NMOS transistor, a tenth NMOS transistor, an eleventh NMOS transistor, a twelfth NMOS transistor, a thirteenth NMOS transistor, a seventh PMOS transistor, an eighth PMOS transistor, a ninth PMOS transistor, and a tenth PMOS transistor; wherein a gate terminal of the seventh NMOS transistor and a gate terminal of the eighth NMOS transistor are connected to each other and serve as the negative input terminal of the error amplifier;

a width to length ratio of the seventh NMOS transistor and the eighth NMOS transistor is $K_2$, where $K_2$ is any real number;

a gate terminal of the sixth NMOS transistor and a gate terminal of the ninth NMOS transistor are connected to each other and serve as a positive input terminal of the error amplifier;

a width to length ratio of the sixth NMOS transistor and the ninth NMOS transistor is $K_2$, where $K_2$ is any real number;

a gate terminal and a drain terminal of the tenth PMOS transistor are short-circuited and connected to a gate terminal of the seventh PMOS transistor and a drain terminal of the eleventh NMOS transistor;

a gate terminal of the tenth NMOS transistor is connected to a gate terminal of the eleventh NMOS transistor and drain terminals of the seventh NMOS transistor and the eighth PMOS transistor;

a drain terminal of the tenth NMOS transistor is connected to source terminals of the seventh NMOS transistor and the ninth NMOS transistor;

a gate terminal of the twelfth NMOS transistor is connected to a gate terminal of the thirteenth NMOS transistor and drain terminals of the sixth NMOS transistor and the ninth PMOS transistor;

a drain terminal of the twelfth NMOS transistor is connected to source terminals of the sixth NMOS transistor and the eighth NMOS transistor;

a gate terminal of the eighth PMOS transistor and a gate terminal of the ninth PMOS transistor are connected to a bias voltage;

a drain terminal of the seventh PMOS transistor and a drain terminal of the thirteenth NMOS transistor are connected to each other and serve as the output terminal of the error amplifier;

source terminals of the tenth NMOS transistor, the eleventh NMOS transistor, the twelfth NMOS transistor, and the thirteenth NMOS transistor are connected to the ground; and source terminals of the seventh PMOS transistor, the eighth PMOS transistor, the ninth PMOS transistor, and the tenth PMOS transistor and drain terminals of the eighth NMOS transistor and the ninth NMOS transistor are connected to the input voltage.

4. The ripple pre-amplification based fully integrated low dropout regulator according to claim 3, wherein the compensation circuit comprises a fourteenth NMOS transistor, a fifteenth NMOS transistor, a sixteenth NMOS transistor, an eleventh PMOS transistor, a twelfth PMOS transistor, a thirteenth PMOS transistor, and a capacitance; wherein a drain terminal of the twelfth PMOS transistor and a drain terminal of the sixteenth NMOS transistor are connected to each other and connected to the series connection point of the first voltage dividing resistor and the second voltage dividing resistor;

the eleventh PMOS transistor and the twelfth PMOS transistor constitute a third current mirror and a third mirror ratio is $1:K_4$, where $K_4$ is any real number;

a gate terminal and a drain terminal of the eleventh PMOS transistor are short-circuited and connected to a gate terminal of the twelfth PMOS transistor and a drain terminal of the fifteenth NMOS transistor;

a gate terminal and a drain terminal of the fourteenth NMOS transistor are short-circuited and connected to a drain terminal of the thirteenth PMOS transistor and a gate terminal of the fifteenth NMOS transistor;

the capacitance is connected between a drain terminal of the power transistor and a drain terminal of the fourteenth NMOS transistor;

a gate terminal of the thirteenth PMOS transistor and a gate terminal of the sixteenth NMOS transistor are connected to the bias voltage;

source terminals of the eleventh PMOS transistor, the twelfth PMOS transistor, and the thirteenth PMOS transistor are connected to the input voltage; and source terminals of the fourteenth NMOS transistor, the fifteenth NMOS transistor, and the sixteenth NMOS transistor are connected to the ground.

5. The ripple pre-amplification based fully integrated low dropout regulator according to claim 1, wherein each of the first voltage dividing resistor and the second voltage dividing resistor is a PMOS transistor with short-circuited gate terminal and drain terminal.

6. A ripple pre-amplification based fully integrated low dropout regulator, comprising:

an error amplifier,
a power transistor,
a miller capacitance,
a first voltage dividing resistor,
a second voltage dividing resistor,
a compensation circuit,
a transconductance amplifier, and
a transimpedance amplifier, wherein a gate terminal of the power transistor is connected to an output terminal of the error amplifier, a source terminal of the power transistor is connected to an input voltage, and a drain terminal of the power transistor is connected to ground through a series connection structure of the first voltage dividing resistor and the second voltage dividing resistor;

a series connection point of the first voltage dividing resistor and the second voltage dividing resistor outputs a feedback voltage;

the Miller capacitance is connected between the drain terminal of the power transistor and the ground;

the compensation circuit is connected between the drain terminal of the power transistor and the series connection point of the first voltage dividing resistor and the second voltage dividing resistor; wherein a positive input terminal of the transconductance amplifier is connected to a reference voltage, a negative input terminal of the transconductance amplifier is connected to the feedback voltage, an output terminal of the transconductance amplifier is connected to a negative input terminal of the transimpedance amplifier and a negative input terminal of the error amplifier; and a positive input terminal of the transimpedance amplifier is connected to the ground, and an output terminal of the transimpedance amplifier is connected to a positive input terminal of the error amplifier wherein the error amplifier comprises a sixth NMOS transistor, a seventh NMOS transistor, an eighth NMOS transistor, a ninth NMOS transistor, a tenth NMOS transistor, an eleventh NMOS transistor, a twelfth NMOS transistor, a thirteenth NMOS transistor, a seventh PMOS transistor, an eighth PMOS transistor, a ninth PMOS transistor, and a tenth PMOS transistor; wherein a gate terminal of the seventh NMOS transistor and a gate terminal of the eighth NMOS transistor are connected to each other and serve as the negative input terminal of the error amplifier;

a width to length ratio of the seventh NMOS transistor and the eighth NMOS transistor is $K_2$, where $K_2$ is any real number;

a gate terminal of the sixth NMOS transistor and a gate terminal of the ninth NMOS transistor are connected to each other and serve as a positive input terminal of the error amplifier;

a width to length ratio of the sixth NMOS transistor and the ninth NMOS transistor is $K_2$, where $K_2$ is any real number;

a gate terminal and a drain terminal of the tenth PMOS transistor are short-circuited and connected to a gate terminal of the seventh PMOS transistor and a drain terminal of the eleventh NMOS transistor;

a gate terminal of the tenth NMOS transistor is connected to a gate terminal of the eleventh NMOS transistor and drain terminals of the seventh NMOS transistor and the eighth PMOS transistor;

a drain terminal of the tenth NMOS transistor is connected to source terminals of the seventh NMOS transistor and the ninth NMOS transistor;

a gate terminal of the twelfth NMOS transistor is connected to a gate terminal of the thirteenth NMOS transistor and drain terminals of the sixth NMOS transistor and the ninth PMOS transistor;

a drain terminal of the twelfth NMOS transistor is connected to source terminals of the sixth NMOS transistor and the eighth NMOS transistor;

a gate terminal of the eighth PMOS transistor and a gate terminal of the ninth PMOS transistor are connected to a bias voltage;

a drain terminal of the seventh PMOS transistor and a drain terminal of the thirteenth NMOS transistor are connected to each other and serve as the output terminal of the error amplifier;

source terminals of the tenth NMOS transistor, the eleventh NMOS transistor, the twelfth NMOS transistor, and the thirteenth NMOS transistor are connected to the ground; and source terminals of the seventh PMOS transistor, the eighth PMOS transistor, the ninth PMOS transistor, and the tenth PMOS transistor and drain terminals of the eighth NMOS transistor and the ninth NMOS transistor are connected to the input voltage.

7. The ripple pre-amplification based fully integrated low dropout regulator according to claim 6, wherein the compensation circuit comprises a fourteenth NMOS transistor, a fifteenth NMOS transistor, a sixteenth NMOS transistor, an eleventh PMOS transistor, a twelfth PMOS transistor, a thirteenth PMOS transistor, and a capacitance; wherein a drain terminal of the twelfth PMOS transistor and a drain terminal of the sixteenth NMOS transistor are connected to each other and connected to the series connection point of the first voltage dividing resistor and the second voltage dividing resistor;

the eleventh PMOS transistor and the twelfth PMOS transistor constitute a third current mirror and a third mirror ratio is $1:K_4$, where $K_4$ is any real number;

a gate terminal and a drain terminal of the eleventh PMOS transistor are short-circuited and connected to a gate terminal of the twelfth PMOS transistor and a drain terminal of the fifteenth NMOS transistor;

a gate terminal and a drain terminal of the fourteenth NMOS transistor are short-circuited and connected to a drain terminal of the thirteenth PMOS transistor and a gate terminal of the fifteenth NMOS transistor;

the capacitance is connected between a drain terminal of the power transistor and a drain terminal of the fourteenth NMOS transistor;

a gate terminal of the thirteenth PMOS transistor and a gate terminal of the sixteenth NMOS transistor are connected to the bias voltage;

source terminals of the eleventh PMOS transistor, the twelfth PMOS transistor, and the thirteenth PMOS transistor are connected to the input voltage; and source terminals of the fourteenth NMOS transistor, the fifteenth NMOS transistor, and the sixteenth NMOS transistor are connected to the ground.

\* \* \* \* \*

UNITED STATES PATENT AND TRADEMARK OFFICE
CERTIFICATE OF CORRECTION

PATENT NO. : 10,353,417 B2
APPLICATION NO. : 16/026081
DATED : July 16, 2019
INVENTOR(S) : Xin Ming et al.

Page 1 of 1

It is certified that error appears in the above-identified patent and that said Letters Patent is hereby corrected as shown below:

On the Title Page

Item (73) Assignee should read: University of Electronic Science and Technology of China, Chengdu (CN); Institute of Electronic and Information Engineering of UESTC in Guangdong, Dongguan (CN)

Signed and Sealed this
Seventh Day of April, 2020

Andrei Iancu
*Director of the United States Patent and Trademark Office*